United States Patent
Hedberg et al.

(10) Patent No.: US 7,698,623 B2
(45) Date of Patent: Apr. 13, 2010

(54) SYSTEMS AND METHODS FOR DECREASING LATENCY IN A DIGITAL TRANSMISSION SYSTEM

(76) Inventors: David Hedberg, 210 E. Creek Dr., Menlo Park, CA (US) 94025; Cimarron Mittelsteadt, 28259 Maitland La., Saugas, CA (US) 91350; Wen Yen Weng, 1719 Federal Ave., #12A, Los Angeles, CA (US) 90025

( * ) Notice: Subject to any disclaimer, the term of this patent is extended or adjusted under 35 U.S.C. 154(b) by 867 days.

(21) Appl. No.: 11/203,617

(22) Filed: Aug. 12, 2005

(65) Prior Publication Data
US 2006/0036923 A1    Feb. 16, 2006

Related U.S. Application Data

(60) Provisional application No. 60/601,556, filed on Aug. 13, 2004.

(51) Int. Cl.
*H03M 13/00* (2006.01)
*H03M 13/03* (2006.01)

(52) U.S. Cl. .................. 714/790; 714/758
(58) Field of Classification Search ........... 714/758, 714/790
See application file for complete search history.

(56) References Cited

U.S. PATENT DOCUMENTS

| | | | |
|---|---|---|---|
| 6,332,209 B1* | 12/2001 | Eroz et al. | 714/790 |
| 6,347,122 B1* | 2/2002 | Chen et al. | 375/262 |
| 6,397,367 B1* | 5/2002 | Park et al. | 714/786 |
| 6,553,540 B1* | 4/2003 | Schramm et al. | 714/790 |
| 6,621,873 B1* | 9/2003 | Lee et al. | 375/295 |
| 6,633,856 B2* | 10/2003 | Richardson et al. | 706/15 |
| 6,976,203 B2* | 12/2005 | Kurtas et al. | 714/755 |
| 7,002,900 B2* | 2/2006 | Walton et al. | 370/208 |
| 7,055,086 B2* | 5/2006 | Lam | 714/776 |
| 7,139,959 B2* | 11/2006 | Hocevar | 714/752 |
| 7,178,080 B2* | 2/2007 | Hocevar | 714/752 |
| 7,409,001 B2* | 8/2008 | Ionescu et al. | 375/267 |
| 2003/0097629 A1* | 5/2003 | Moon et al. | 714/751 |
| 2004/0148560 A1 | 7/2004 | Hocevar | 714/801 |
| 2005/0257119 A1 | 11/2005 | Blankenship et al. | 714/759 |

OTHER PUBLICATIONS

Lu, B.; Xiaodong Wang; Narayanan, K.R.; LDPC-based space-time coded OFDM systems over correlated fading channels: Performance analysis and receiver design, IEEE Transactions on Communications, vol. 50, Issue 1, Jan. 2002 pp. 74-88.*
Mohammad M. Mansour and Naresh R. Shanhhag; "Turbo decoder architectures for low-density parity check codes", Global Communications Conference (Globecomm) (IEEE, 2002), pp. 1383-1388.*
International Search Report.

* cited by examiner

*Primary Examiner*—Joseph D Torres
(74) *Attorney, Agent, or Firm*—McDonnell Boehnen Hulbert & Berghoff LLP

(57) ABSTRACT

Disclosed herein are various embodiments of methods, systems, and apparatus for encoding OFDM packets in a digital communication system. In one exemplary method embodiment, LDPC codewords in an IEEE 802.11 wireless transmission are shortened, decreasing the iterations necessary to insure accurate communications. The codewords are shortened by adding known bits in predetermined locations in the last data symbol of a packet.

12 Claims, 6 Drawing Sheets

# SYSTEMS AND METHODS FOR DECREASING LATENCY IN A DIGITAL TRANSMISSION SYSTEM

CROSS-REFERENCE TO RELATED APPLICATION

This application claims priority to copending U.S. provisional application having Ser. No. 60/601,556, filed Aug. 13, 2004, which is entirely incorporated herein by reference.

1. FIELD OF THE INVENTION

The present invention is generally related to digital communications and, more particularly, is related to a system and method for block encoding and decoding of digital communications.

2. RELATED ART

Communication networks come in a variety of forms. Notable networks include wireline and wireless. Wireline networks include local area networks (LANs), DSL networks, and cable networks, among others. Wireless networks include cellular telephone networks, classic land mobile radio networks and satellite transmission networks, among others. These wireless networks are typically characterized as wide area networks. More recently, wireless local area networks and wireless home networks have been proposed, and standards, such as Bluetooth and IEEE 802.11, have been introduced to govern the development of wireless equipment for such localized networks.

A wireless local area network (LAN) typically uses infrared (IR) or radio frequency (RF) communications channels to communicate between portable or mobile computer terminals and stationary access points or base stations. These access points are, in turn, connected by a wired or wireless communications channel to a network infrastructure which connects groups of access points together to form the LAN, including, optionally, one or more host computer systems.

Wireless protocols such as Bluetooth and IEEE 802.11 support the logical interconnections of such portable roaming terminals having a variety of types of communication capabilities to host computers. The logical interconnections are based upon an infrastructure in which at least some of the terminals are capable of communicating with at least two of the access points when located within a predetermined range, each terminal being normally associated, and in communication, with a single one of the access points. Based on the overall spatial layout, response time, and loading requirements of the network, different networking schemes and communication protocols have been designed so as to most efficiently regulate the communications.

IEEE Standard 802.11 ("802.11") is set out in "Wireless LAN Medium Access Control (MAC) and Physical Layer (PHY) Specifications" and is available from the IEEE Standards Department, Piscataway, N.J. 802.11 permits either IR or RF communications at 1 Mbps, 2 Mbps and higher data rates, a medium access technique similar to carrier sense multiple access/collision avoidance (CSMA/CA), a power-save mode for battery-operated mobile stations, seamless roaming in a full cellular network, high throughput operation, diverse antenna systems designed to eliminate "dead spots," and an easy interface to existing network infrastructures.

The 802.11a standard defines data rates of 6, 12, 18, 24, 36 and 54 Mbps in the 5 GHz band. Demand for higher data rates may result in the need for devices that can communicate with each other at the higher rates, yet co-exist in the same WLAN environment or area without significant interference or interruption from each other, regardless of whether the higher data rate devices can communicate with the 802.11a devices. It may further be desired that high data rate devices be able to communicate with the 802.11a devices, such as at any of the standard 802.11a rates.

One challenge in designing a wireless transmission system is the channel coding method. One coding method uses low density parity check codes (LDPCCs). LDPCCs are block codes with long block length. Their performance advantages are derived by virtue of the long block length and code structures, which allow soft iterative decoding to aid decoding decision convergence. Error rate performance improves with increases in block length and the number of decoding iterations performed.

A block code has parameters (n,k) where n is the block length (# bits) and k is the number of information bits encoded per block. Traditional block encoders add a fixed number of parity bits, m=n−k, to each block of k information bits to form an n bit encoded block with code rate R=k/n.

The challenge in a packet based WLAN radio system such as for 802.11 is to pick an LDPC code block size and a number iterations to best fit the packet size (total number of available coded bits) while balancing the practical complexity of the decoder. As the transmission data rate increases, the decoder must run faster on average to keep up with data flow. For typical LDPC codes of interest, the decoder must use a large degree of parallelism to perform a desired number of decoding iterations on each received soft code word. Thus the upper limit of decoding speed is governed approximately by the product of the maximum average coded transmission rate, the number of parity bits per block (1-R), and the number of decoding iterations performed per block. To keep the bit error rate performance (or more appropriately the code block error rate performance) approximately constant across the packet, the codewords in a packet structure must be of approximately equal size, equal rate, and equal number of decoding iterations. Otherwise the weakest code block in the packet will tend to dominate the overall packet error rate.

Another challenge for the decoder in the WLAN radio is to be able to promptly complete the decoding at the end of reception of a packet so that a return acknowledgement can be immediately sent back to the transmitter. WLAN radios rely on this "ARQ" mechanism to communicate packet errors and instigate retransmission of the packet in the event of an error. The minimum time allowed for this varies according to standard, but can be as short as 6 us or so for next generation 802.11 radios. The time between end of reception and the transmission of an acknowledgement is "dead" airtime and thus contributes to network overhead. Therefore, the minimum interframe transmission time (SIFs) for acknowledgement is optimized in the standard to be as short as possible within practical constraints.

Increasing the data rate and allowing more effective use of bandwidth for devices operating in these bands enables more efficient communications. A higher data rate may enable service providers to more effectively use their allotted spectrum. Consumers may realize a cost savings as well.

3. SUMMARY

This disclosure describes systems and methods for encoding and decoding packets in a digital communication system. In one exemplary method embodiment, decoding latency is reduced by encoding a transmission packet as a string of OFDM symbols using low density parity check (LDPC) coding; and shortening the LDPC code word sizes to fit into an integral number of OFDM symbols. In an exemplary system embodiment, a system targeted at a high-speed wireless LAN standard includes a processor configured to encode a transmission packet as a string of OFDM symbols using low density parity check (LDPC) coding, and to shorten the LDPC code word sizes to fit into an integral number of OFDM symbols.

Other systems, methods, features and advantages of the disclosure will be or will become apparent to one with skill in the art upon examination of the following figures and detailed description. It is intended that all such additional systems, methods, features and advantages be included within this description, be within the scope of the invention, and be protected by the accompanying claims.

4. BRIEF DESCRIPTION OF THE DRAWINGS

The components in the figures are not necessarily to scale, emphasis instead being placed upon illustrating the principles of the disclosed systems and methods. In the figures, like reference numerals designate corresponding parts throughout the different views.

5. DETAILED DESCRIPTION

Disclosed herein are various embodiments of encoding systems and methods. One system embodiment comprises a processor that receives a data signal, encodes it using LDPC encoding, and decreases the decoding latency by shortening the tail-end symbol. The encoding may be done in any type of processor such as a PHY layer processor, though not limited to a PHY layer, including, but not limited to, a digital signal processor (DSP), a microprocessor (MCU), a general purpose processor, an application specific integrated circuit (ASIC), among others. A new standard is being proposed, referred to as IEEE 802.11n (the "802.11n proposal"), which is a high data rate extension of the 802.11a standard at 5 GHz. It is noted that, at the present time, the 802.11n proposal is only a proposal and is not yet a completely defined standard. Other applicable standards include Bluetooth, xDSL, other sections of 802.11, etc.

Figure 1:
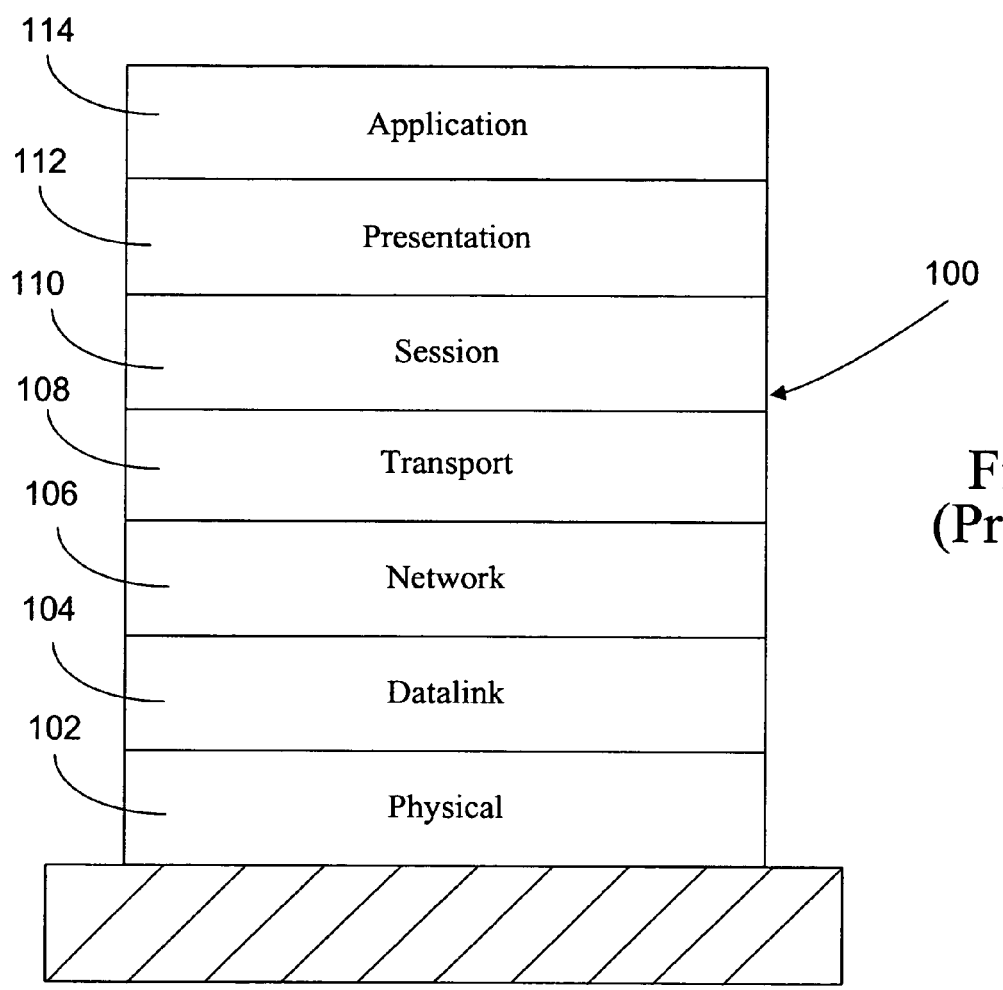
FIG. 1 is a block diagram illustrating an International Organization for Standards (ISO) Basic Reference Model of open systems interconnection (OSI).

802.11 is directed to wireless LANs, and in particular specifies the MAC and the PHY layers. These layers are intended to correspond closely to the two lowest layers of a system based on the ISO Basic Reference Model of OSI, i.e., the data link layer and the physical layer. FIG. 1 shows a diagrammatic representation of an open systems interconnection (OSI) layered model 100 developed by the International Organization for Standards (ISO) for describing the exchange of information between layers in communication networks. The OSI layered model 100 is particularly useful for separating the technological functions of each layer, and thereby facilitating the modification or update of a given layer without detrimentally impacting on the functions of neighboring layers.

At a lower most layer, the OSI model 100 has a physical layer or PHY layer 102 that is responsible for encoding and decoding data into signals that are transmitted across a particular medium. Above the PHY layer 102, a data link layer 104 is defined for providing reliable transmission of data over a network while performing appropriate interfacing with the PHY layer 102 and a network layer 106. The network layer 106 is responsible for routing data between nodes in a network, and for initiating, maintaining and terminating a communication link between users connected to the nodes. A transport layer 108 is responsible for performing data transfers within a particular level of service quality. A session layer 110 is generally concerned with controlling when users are able to transmit and receive data. A presentation layer 112 is responsible for translating, converting, compressing and decompressing data being transmitted across a medium. Finally, an application layer 114 provides users with suitable interfaces for accessing and connecting to a network.

Figure 2:
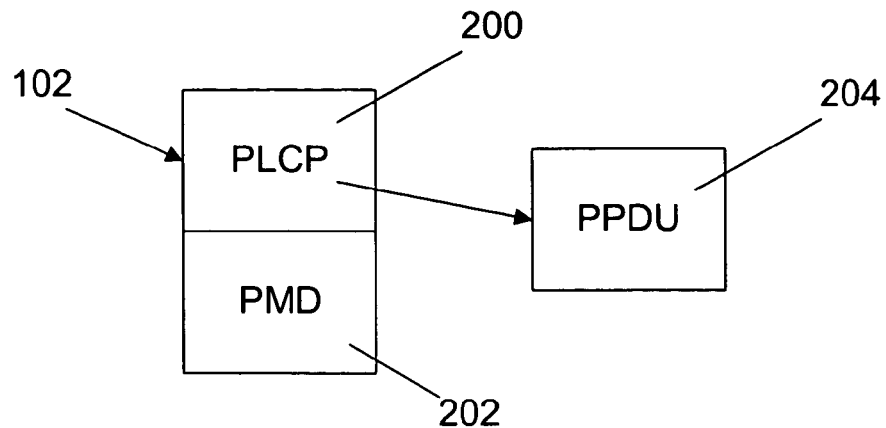
FIG. 2 is a block diagram of the PHY layer of FIG. 1.

As provided in FIG. 2, PHY layer 102 includes Physical Layer Convergence Procedure (PLCP) 200 and Physical Medium Dependent (PMD) 202 sub-layers. A PHY layer processor is configured to perform functionality of the preferred embodiments. A system of communications may comprise such a processor, alone, or in combination with other logic or components. A system of communications may further be embodied in a wireless radio, or other communication device. Such a communication device may include many wireless communication devices, including computers (desktop, portable, laptop, etc.), consumer electronic devices (e.g., multi-media players), compatible telecommunication devices, personal digital assistants (PDAs), or any other type of network devices, such as printers, fax machines, scanners, hubs, switches, routers, set-top boxes, televisions with communication capability, etc. In some embodiments, a processor may be found in other layers. PLCP 200 prepares 802.11 frames for transmission and directs PMD 202 to actually transmit signals, change radio channels, receive signals, etc. PLCP 200 takes each 802.11 frame that is to be transmitted and forms PLCP protocol data unit (PPDU) 204.

Figure 3:
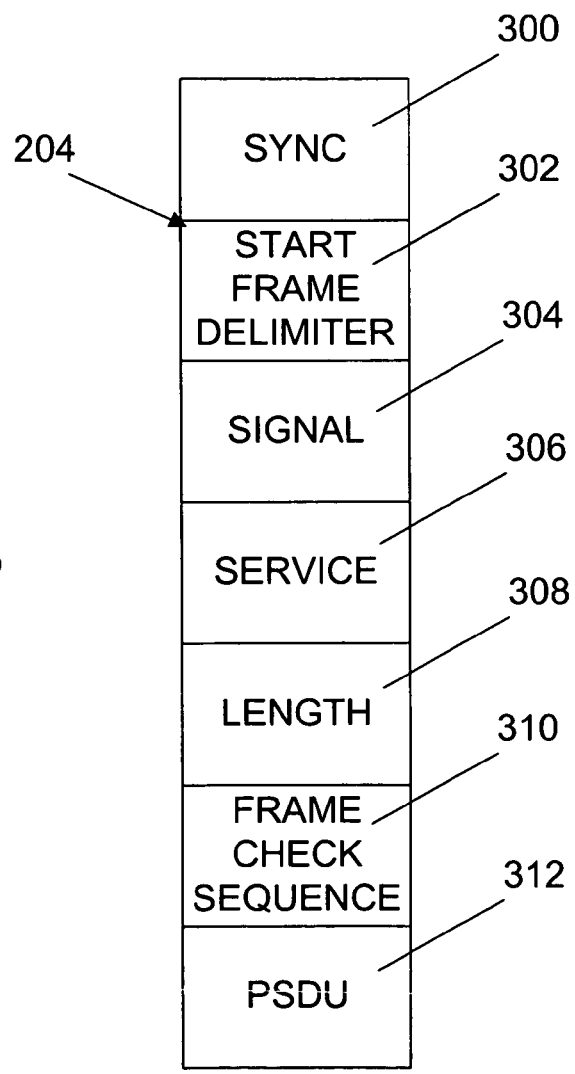
FIG. 3 is a block diagram of the PPDU layer of FIG. 2.

As provided in FIG. 3, PPDU 204 includes the following fields in addition to the frame fields imposed by the MAC Layer: Sync 300, Start Frame Delimiter 302, Signal 304, Service 306, Length 308, Frame Check Sequence 310, and Physical Layer Service Data Unit 312 (PSDU). Sync field 300 consists of alternating 0s and 1s, alerting the receiver that a receivable signal is present. The receiver begins synchronizing with the incoming signal after detecting Sync field 300. Start Frame Delimiter field 302 is always 1111001110100000 and defines the beginning of a frame. Signal field 304 identifies the data rate of the 802.11 frame, with its binary value equal to the data rate divided by 100 Kbps. For example, field 304 contains the value of 00001010 for 1 Mbps, 00010100 for 2 Mbps, and so on. PLCP 200, however, are always sent at the lowest rate, which is 1 Mbps. This ensures that the receiver is initially uses the correct demodulation mechanism, which changes with different data rates.

Service field 306 is always set to 00000000, and the 802.11 standard reserves it for future use. Length field 308 represents the number of microseconds that it takes to transmit the contents of PPDU 204, and the receiver uses this information to determine the end of the frame. In order to detect possible errors in the Physical Layer header, the standard defines Frame Check Sequence field 310 for containing a 16-bit cyclic redundancy check (CRC) result. The MAC Layer also performs error detection functions on PPDU 204 contents as well. PSDU field 312 represents the contents of the PPDU (i.e., the actual 802.11 frame being sent).

PPDU 204 and, specifically PSDU field 312, are the basic packet data units when a data frame is being transmitted. The "payload" is the data size in bytes that a packet will carry. Depending on modulation and coding rates selected for transmission, the amount of coded data that needs to be packed into the OFDM frame size will vary.

Prior to a transmission, the media access controller (MAC) 104 signals PHY 102 to define the number of payload bytes and the desired modulation, coding, and rate parameters for the transmission. Then the PPDU encoding algorithm is performed by the PHY encoder and decoder to determine the actual packet construction parameters to use for the designated PPDU transmission. Packets are composed, transmitted, received, and decoded independently with codeword and OFDM symbol structures that may be different for each packet.

A data signal is encoded in PHY layer 102 for transmission. Low density parity check codes (LDPCCs) are block codes with long block length that are used for encoding the data signal. LDPCCs derive performance advantages by virtue of the long block length and code structures, which allow soft iterative decoding to aid decoding decision convergence. Error rate performance improves with increases in block length and the number of decoding iterations performed.

Since the LDPCC block sizes are typically larger than an OFDM symbol bit carrying capacity, multiple symbols of coded data may need to be decoded at the end of transmission within the given short SIFs latency time. This usually means that the decoder must accelerate its decoding speed after the end of receipt of the last OFDM symbol in the transmission. The decoder will have more parallelism (higher complexity) if it must operate with much higher peak speed during the end of transmission decoding. A PPDU encoding algorithm (also sometimes called codeword concatenation algorithm) can minimize the peak to average speed requirement of the decoder. This will result in practically efficient use of decoding hardware—minimum complexity.

The PPDU encoding (or concatenation) algorithm disclosed uses a process of codeblock size adaptation and codeword shortening to ensure that the end of transmission decoding speed increase can be minimized relative to average speed throughout the packet.

To achieve performance with LDPC codes, the decoding process is iterated. LDPC codes are based on a representation of the process that the decoder applies. The decoder will perform this process for multiple iterations. Typically, to achieve the performance that these codes offer, several decoding iterations may be performed (e.g. ten or twelve). Decoders are designed such that a large number of iterations can be supported. The number of iterations is a variable that can be incorporated into an algorithm and adjusted to control the amount of work that the decoder performs in a given amount of time.

LPDCC decoders have high logic complexity due to the large code block size and the amount of parallelism necessary to process a large maximum number of decoding iterations with shortened packet decoding latency. Conventional implementations use a single code block size; PSDUs are encoded with zero pad bits or fill bits added as needed so that an integral number of code blocks and an integral number of OFDM symbols can be transmitted. With the relatively large block size required for LDPC codes (at least 2 k bits) the effective rate loss due to zero padding can be substantial, especially for shorter packets, for example, less than two kilobytes. For example, a 1 kilobyte block could experience a 20% loss in effective rate or more depending on transmission mode. This negatively impacts throughput performance. Decoding latency and, hence, complexity can be reduced if the maximum number of required decoding iterations can be reduced.

Block codes can be constructed such that a fixed number of information bits combined with a fixed number of parity bits are systematic to form the code block. The rate of the code is simply the number of information bits divided by the total block size. The code is more powerful if there are more parity bits per information bit in that block. The rate of the code is determined by how many information bits are present relative to the number of parity bits. The code is normally a fixed block size for a given code rate. Shortening fixes a number of those information bits to known bit values, which aren't transmitted. The rate of the code is effectively reduced in this manner. These bits are known by the encoder and decoder; so the decoder already knows some of the information perfectly without it being transmitted. That means it can be coded more effectively. It is a matter of predefining the information bits to a known value and then not transmitting those bits. At the receive side, the decoder simply fills in those bits of which it has knowledge. This shortening algorithm is applicable to any payload data size.

Figure 4:
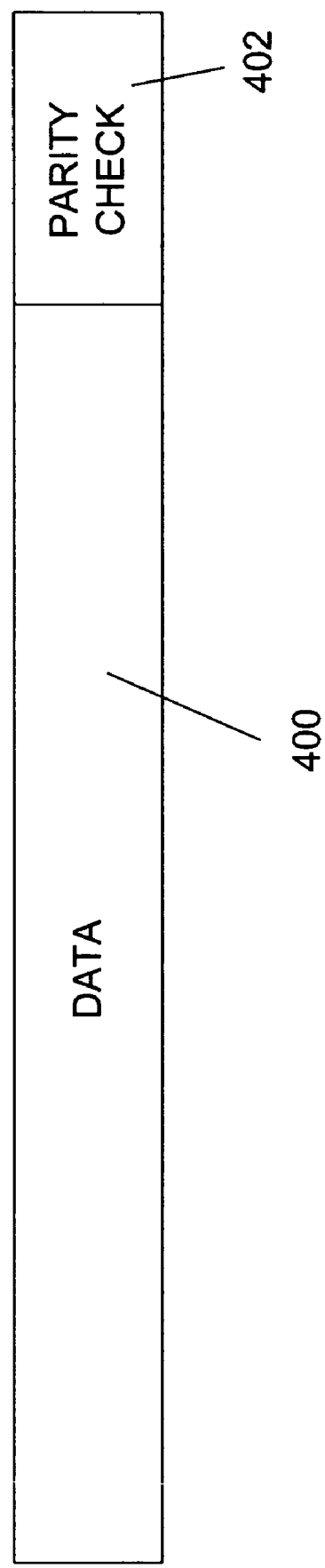
FIG. 4 is a block diagram of a packet using LDPC coding.

FIG. 4 provides a block diagram of a full LDPC code block transmitted in 3 64 QAM OFDM symbols including data block 400 and parity check block 402. In this nonlimiting example, the entire block is 1944 bits long, with data block 400 comprising 1458 data bits and parity check block 402 comprising 486 bits.

Figure 5:
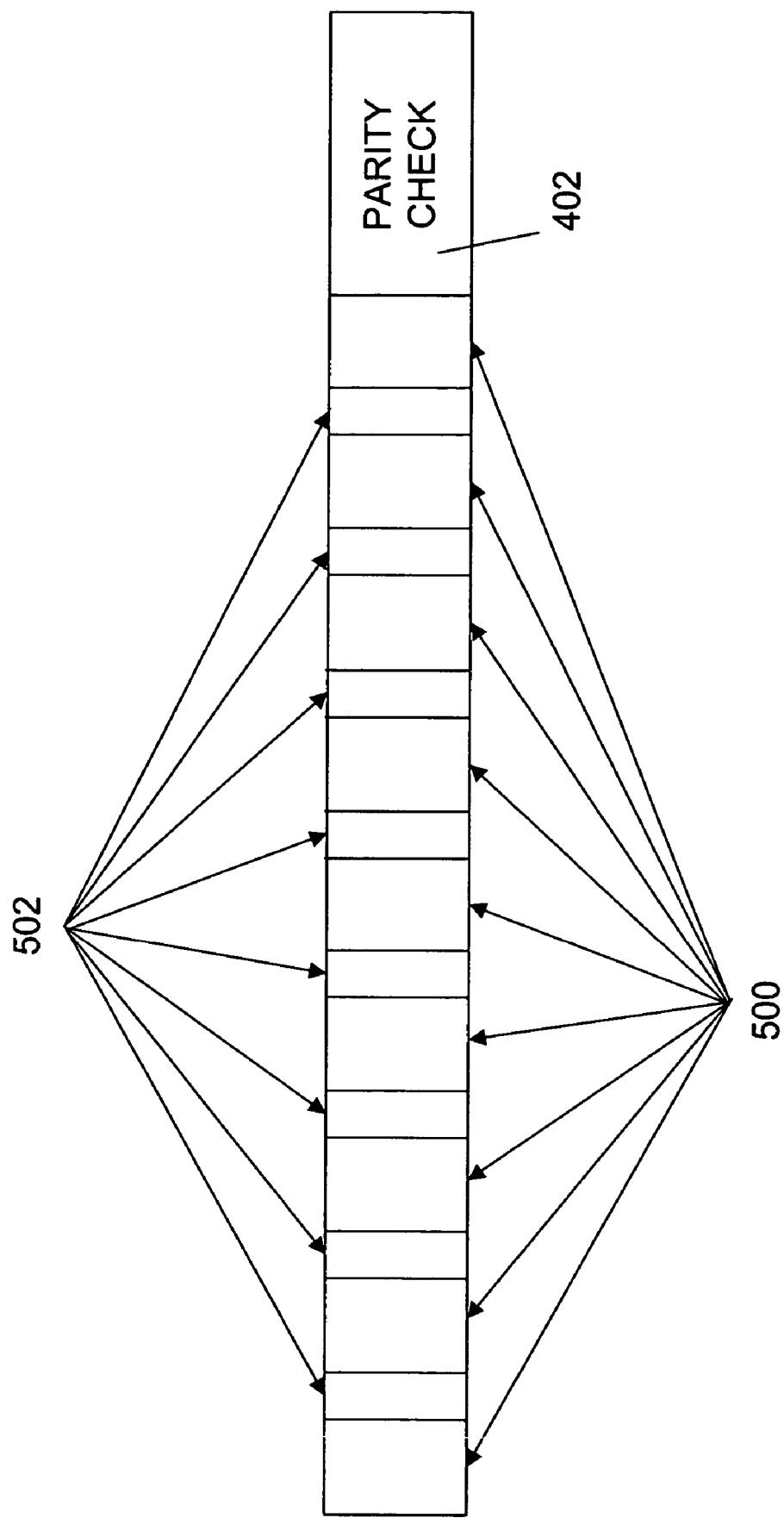
FIG. 5 is a block diagram of an exemplary embodiment of a shortened packet of FIG. 4.

FIG. 5 provides a diagram of a shortened version of the code block of FIG. 4. The code block of FIG. 5 can be transmitted in 2 64 QAM OFDM symbols. Zeros are placed in predefined bits 502, which comprises 648 bits in this nonlimiting example. The remaining data 500 to be transmitted comprises 810 bits with the same 486 bits in parity check block 402.

Decoding time within the packet is determined by the time available until the next full code word is received. The code word transmission time could be 12 microseconds for a 40 MHz bandwidth packet in a high rate mode transmission. Decoding time at the end of the packet is determined by the number of iterations required to decode the last code word in the packet. This constraint is tighter due to radio SIF requirements. For example, 6 microseconds max is envisioned for an high throughput wireless LAN radio.

Instead of processing one long code block, the packet can be separated into smaller pieces. Any leftover space at the end of the transmission block can be utilized for other purposes. Coded blocks are constructed and mapped to transmission frames used in packets. The length of the payload of the data that is to be sent on each packet is variable and can vary over a wide range. There may be an arbitrary number of coded blocks that are constrained by the basic structure of the code and those need to be mapped efficiently into the transmission frame to minimize the amount of excess bits that need to be filled in. A shortening algorithm constructs the code blocks so that at the end of transmission the number of iterations can be reduced without compromising the performance of the decoder.

The shortening technique reduces the rate of the code so it will decode with less iterations at the end of transmission. The reliability (bit error rate (BER) performance) of decoding any one codeword improves with the number of iterations used in the decoding process. In order that the BER be balanced for all codewords in the packet, the number of iterations should be the same for all codewords, assuming that these codewords all utilize the same construction rules. Typically, it is preferable to have several (e.g. 6-12) decoding iterations per decoded codeword to achieve reasonable BER performance. However, if a particular codeword is shortened, it would use fewer iterations to decode with the same reliability as for a full non-shortened codeword.

The primary techniques of codeblock shortening and blocksize fitting of the tail sequence of code block sizes in a packet can be examined. An example codeblock size has 1944 bits at rate R=⅔. The number of information bits per block is 1296 and the number of parity bits per block is 648.

The rate of transmission can be reduced by pre-defining some of the information bits (e.g., 64 bits) to known values prior to encoding. Then, the parity bits are calculated on the reduced number of information bits+predefined bits. Only the reduced block of information bits and parity bits are transmitted. The receiver knows this a priori and inserts the predefined missing bits prior to decoding. The decoder knows the pre-defined bits perfectly and can thus improve the decoding likelihoods for the remaining bits that were transmitted and subject to noise corruption.

The impact of shortening is to effectively reduce the rate of the code—and thus increase the performance of the code. The net coded block size that is transmitted is shortened, but the decoded block size is the original 1944 bit size. The only difference is that some bits are known. Shortened blocks must be decoded faster since fewer bits are received for each transmitted block—assuming that the coded transmission data rate is constant.

The bit error rate performance of shortened codeblocks increases as a function of the amount of shortening (also correlated to the effective reduction in coded rate in the transmission). Therefore, the number of iterations required for decoding a shortened codeword can be reduced and the same error rate performance can be achieved as for non-shortened codewords.

This relationship is not linear, and is exploited in order to reduce the number of iterations required in shortened "tail sequence" blocks in the packet—particularly for those codewords that must still be decoded at the end of transmission.

For example, with a relatively small amount of codeword shortening, the number of iterations required for a target level of BER performance can be cut in half—thus allowing the decoder to finish decoding in half the time. The decoder, which is a very complex logic circuit or device, can run at high speed. The complexity is related to the parallel functionality, running parallel computations to decode code blocks for high data rates. In addition, when the end of the packet is reached, the remaining section at the end of the transmission is decoded in a constrained amount of time. A subsequent packet can be received very soon after the previous one is finished. This constraint on the decoder adds to the receiver complexity. The methods disclosed herein simplify the decoder, increasing the decoding performance at the end of transmission, thereby reducing the decoder latency.

There is an average decoding rate which occurs during the packet and a peak decoding rate that is required to satisfy the end of transmission constraint. The peak decoding latency, or the peak speed to average speed ratio, can be reduced to decrease the decoder latency.

IEEE 802.11 radios have different modes of operation with different modulations and coding rates, which result in different frame sizes and different symbol sizes. In addition, there are multiple symbols or frames that are transmitted simultaneously. Exemplary embodiments of this algorithm yield an optimum construction for these modes. By reducing the latency of the symbol at the end of the packet, the iterations necessary to decode the packet are reduced and the peak speed of the decoder relative to decoding the last symbol can remain close to the average speed.

One goal for exemplary embodiments of a shortening algorithm is for it to be applicable for each packet, independent of the structure and mode of the packet, for both the transmitter and receiver with reduced amount of processing, so that the parameters that are required to construct these packets can be generated at the time of transmission. The packets can also be generated exactly the same way at the time of reception. In this manner, the receiver performs the same algorithm that the transmitter does. The receiver knows what is coming in, in terms of structure, and it can adjust the decoder to handle that particular structure. Each packet and each mode can be different for subsequent transmissions.

To decrease the decoding latency, the LDPC code words are structured such that the last LDPCC block requires substantial fewer iterations for adequate decoding reliability. The last block in a packet is forced to be a shortened code word where some of the information bits are predefined. The LDPC code word and the shortened code word sizes are constructed to fit into an integral number of OFDM symbols for each modulation mode such that a minimum (or zero in many cases) number of pad bits are required to encode the packet. This results in a rich set of target payload block sizes for the MAC, each having a nearly full transmission rate and full error reliability. The encoding steps of a PSDU block include, but are not limited to: composing and encoding each packet as a string of an integral number of OFDM symbols which comprise a number of LDPC code words plus one shortened LDPC code word at a lower effective rate; selecting shortened code block structures; and defining the appropriate optimum full plus shortened block size formulas for each PHY modulation rate and MIMO stream configuration based from a single multirate LDPC code structure.

In composing and encoding each packet as a string of an integral number of OFDM symbols, the MAC can assist in aggregating data into bundles that encode with maximum effective rate. That is maximizing the number of actual information bits divided by the number of coded bits in the packet. This forces the number of optimum data packet sizes to be maximized.

The next step is to select the shortened code block structures so as to allow the last code block to decode with many fewer iterations and shorter latency times, thus minimizing the required amount of parallelism in decode processing.

Lastly, define the appropriate optimum full plus shortened block size formulas for each PHY modulation rate and MIMO stream configuration based from a single multirate LDPC code structure. As an example, a full LDPC code block can be transmitted in three 64 QAM OFDM symbols with 1,458 bits of data and 486 bits of parity check. In an example of a shortened LDPC code block transmitted in two 64 QAM OFDM symbols, there are predefined zeros which are not transmitted which make up 648 bits of the data block. There are then 810 information data bits, which are transmitted and 486 parity check bits.

The optimum PSDU sizes depend on the transmission parameters selected such as the modulation mode and stream configuration. They obey simple formulas that can be mechanized easily for all modes. There are a large number of relatively uniformly spaced optimum PSDU data sizes within the range of 1 kilobytes to 8 kilobytes for the MAC to target. The corresponding data packet lengths require few or no zero padding bits to be inserted and that is at full code rate transmission efficiency within those possible with the selected LDPC code block structure. For these symbol block sizes, the effective transmission rate increases very quickly with increasing packet length to the ideal asymptotic code rates ¾ and ⅚ respectively.

The asymptotic code rates are the basic rates of the codes designed into the system, assuming a full code block with no shortening. The effect of codeword shortening is to reduce the effective coded rate of the transmission. The basic coding rates targeted in next generation WLAN standards may include, for example, ½, ⅔, ¾, or ⅚. When a packet is to be transmitted, the MAC decides the modulation mode and which of these basic rates to target in the transmission. The target code rate is viewed as an upper bound for the actual rate used after PPDU encoding the data into a packet. The code performance improves with lower rates (because there are more parity bits per information bit). So the PPDU encoding must ensure that data is encoded at least as reliably as it would be with the selected basic rate, R. The actual transmission rate, therefore, must be less than or equal to R.

For a given rate, it is preferred that the PHY not use significantly more OFDM symbols than required to transmit the encoded data at that rate. Thus, once the OFDM frame size of a packet is determined, if there are not enough payload bits to fill the frame, then the PPDU encoding algorithm can use code block shortening as a means of optimizing the effective rate for a given OFDM frame capacity. The number of shortening bits and fill bits feasible will depend on the codeword construction of the packet and the number of bytes to be transmitted in the payload. It is a complicated tradeoff for LDPC codes because the codeword length is not the same as the OFDM symbol size, and the latter may vary over a wide range depending on transmission mode. When the coded payload fits an integral number of full codeblocks, then the effective coded rate asymptotically approaches the target rate of R.

Figure 6:
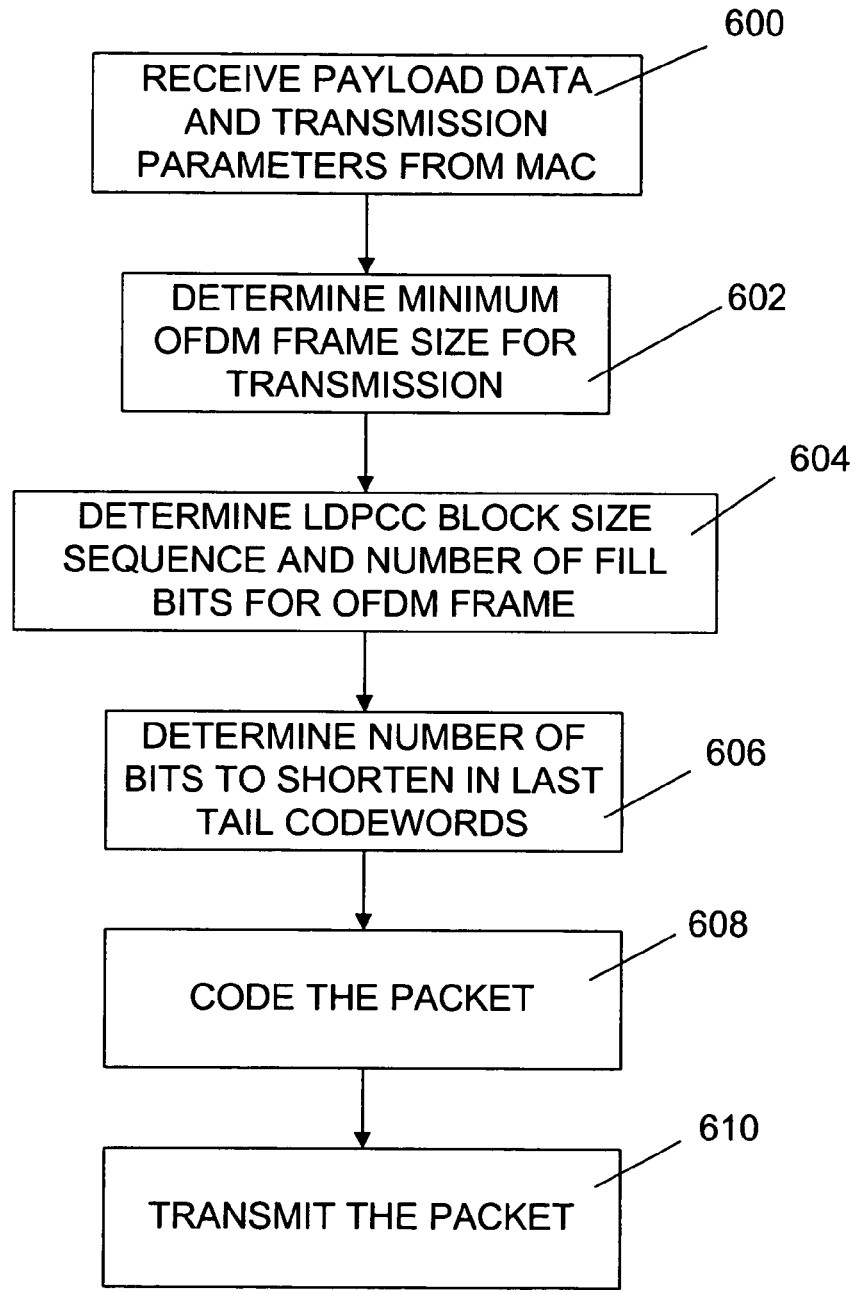
FIG. 6 is a flow diagram of an exemplary embodiment of a method of shortening a packet of FIG. 4.

FIG. 6 provides a block diagram of an exemplary embodiment of an encoding method using shortening. In block 600, the encoder receives the payload data and transmission parameters from the MAC. In block 602, a processor determines the minimum OFDM frame size for transmission. In block 604, a processor determines the LDPCC block size sequence and number of fill bits (ones, zeros, or both) for the OFDM frame. In block 606, a processor determines the number of bits to shorten in the last tail codewords. In block 608, a processor codes the packet, and the packet is transmitted in block 610.

Figure 7:
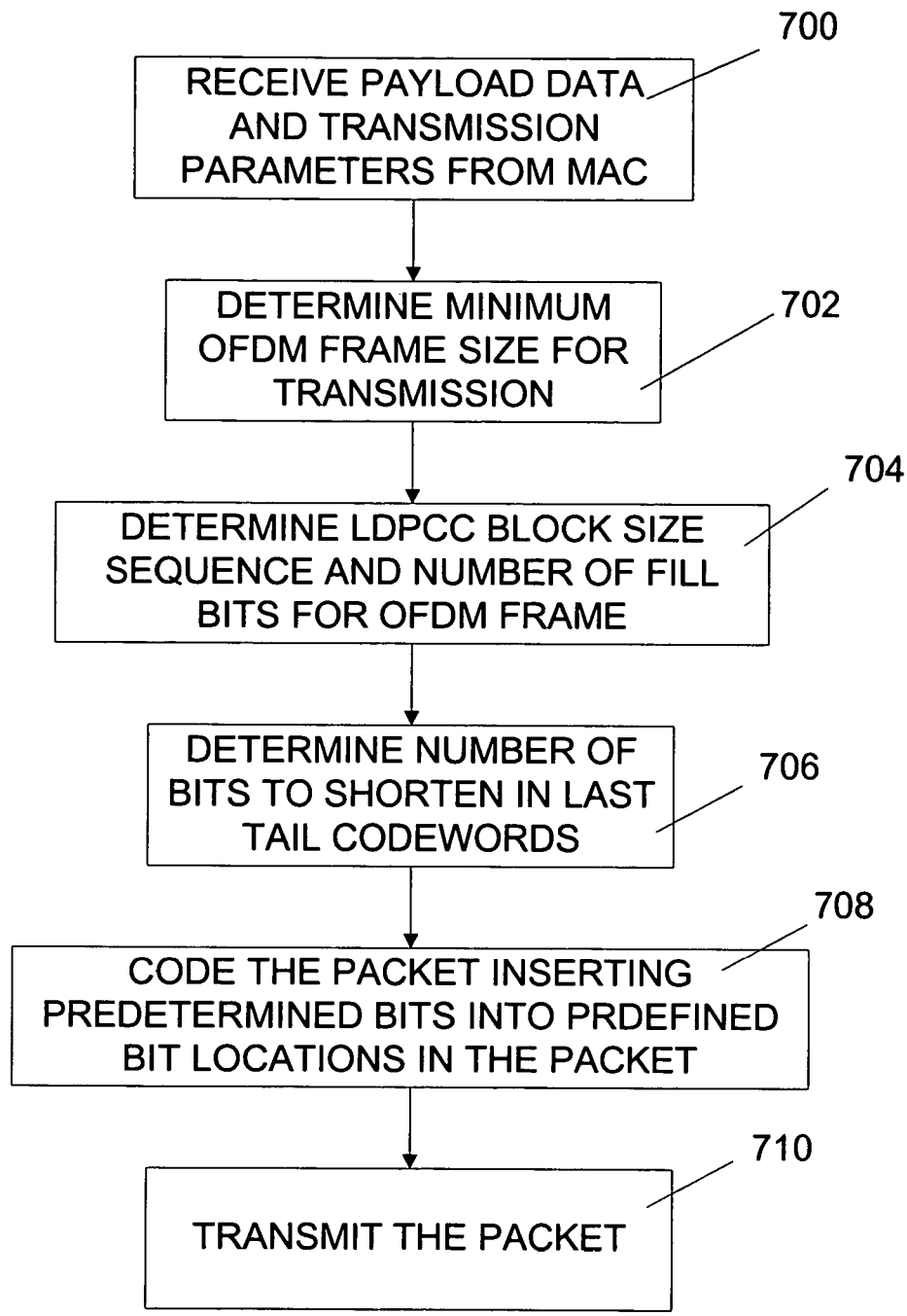
FIG. 7 is a flow diagram of an exemplary embodiment of a method of shortening a packet of FIG. 4.

FIG. 7 provides a block diagram of an exemplary embodiment of an encoding method using shortening. In block 700, the encoder receives the payload data and transmission parameters from the MAC. In block 702, a processor determines the minimum OFDM frame size for transmission. In block 704, a processor determines the LDPCC block size sequence and number of fill bits (ones, zeros, or both) for the OFDM frame. In block 706, a processor determines the number of bits to shorten in the last tail codewords. In block 708, a processor codes the packet, inserting predetermined bits into predetermined bit locations. The packet is transmitted in block 710.

While various embodiments of the invention have been described, it will be apparent to those of ordinary skill in the art that many more embodiments and implementations are possible that are within the scope of this invention.

What is claimed is:

1. A method, comprising:
   receiving payload data;
   dividing the payload data into a plurality of data blocks comprising a last data block;
   encoding each of the plurality of data blocks into a code word, wherein the code word associated with the last data block is a shortened code word encoded by:
      inserting predefined bits into the last data block at predefined bit locations,
      generating an intermediate code word by determining low density parity check (LDPC) bits from the last data block with inserted predefined bits, and
      generating the shortened code word by removing all of the predefined bits from the intermediate code word;
   reducing decoding latency by encoding the plurality of code words other than the shortened code word such that each code word other than the shortened code word is decodable with at least a first number of iterations to achieve a desired bit error rate (BER), and the shortened code word is encoded such that the shortened code word is decodable using a second number of iterations to achieve the desired BER, and wherein the second number of iterations is less than the first number of iterations; and
   transmitting each code word as a string of OFDM symbols such that each code word fits into an integral number of OFDM symbols.

2. The method of claim 1, wherein encoding the shortened code words further comprises aggregating code words with a maximum effective rate into bundles, the aggregating performed in a MAC.

3. The method of claim 1, further comprising determining a modulation mode and stream configuration.

4. The method of claim 3, wherein generating shortened code words comprises generating shortened code words whose sizes correspond to the modulation mode and stream configuration.

5. The method of claim 1, further comprising:
   composing a packet based on the string of OFDM symbols; and
   transmitting the packet.

6. The method of claim 5, further comprising:
   determining a transmission rate, and wherein composing the packet comprises composing the packet based on the determined transmission rate.

7. The method of claim 6, wherein composing the packet based on the determined transmission rate comprises:
   determining a number of OFDM symbols required to transmit the packet at the determined transmission rate;
   determining a frame size for the packet; and
   composing the packet based on the number of OFDM symbols and the frame size.

8. The method of claim 7, wherein a number of the predefined bits is determined based on the frame size.

9. The method of claim 8, wherein composing the packet comprises determining a number of fill bits.

10. The method of claim 7, wherein determining the frame size of the packet comprises determining a minimum frame size for transmission of the packet.

11. The method of claim 1, wherein generating shortened code words comprises selecting shortened code block structures for at least a last code block of a packet.

12. The method of claim 11, wherein the code block structures are selected with predefined information bits and a minimum number of pad bits for at least the last code block of the packet as to require fewer iterations to decode the at least the last code block of the packet.

* * * * *